(12) United States Patent
Komiya (10) Patent No.: US 9,607,945 B2
(45) Date of Patent: Mar. 28, 2017

(54) SEMICONDUCTOR DEVICE COMPRISING POWER ELEMENTS IN JUXTAPOSITION ORDER

(71) Applicant: ROHM CO., LTD., Kyoto (JP)

(72) Inventor: Kunihiro Komiya, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 34 days.

(21) Appl. No.: 14/821,493

(22) Filed: Aug. 7, 2015

(65) Prior Publication Data
US 2016/0071798 A1 Mar. 10, 2016

Related U.S. Application Data

(60) Division of application No. 11/778,526, filed on Jul. 16, 2007, now abandoned, which is a continuation of
(Continued)

(30) Foreign Application Priority Data

Oct. 20, 2003 (JP) ................................. 2003-358599

(51) Int. Cl.
*H01L 27/118* (2006.01)
*H01L 23/528* (2006.01)
(Continued)

(52) U.S. Cl.
CPC ...... *H01L 23/5286* (2013.01); *H01L 23/5386* (2013.01); *H01L 24/06* (2013.01);
(Continued)

(58) Field of Classification Search
CPC ............ H01L 2924/00; H01L 2924/14; H01L 23/5286; H01L 24/06; H01L 23/528;
(Continued)

(56) References Cited

U.S. PATENT DOCUMENTS 5,155,570 A 10/1992 Tomizuka et al.
5,239,448 A 8/1993 Perkins et al.
(Continued)

FOREIGN PATENT DOCUMENTS

| JP | 07-135299 | 5/1995 |
| JP | 11-168178 | 6/1999 |
| WO | WO 0250898 A1 | 6/2002 |

*Primary Examiner* — Jerome Jackson, Jr.
*Assistant Examiner* — David Chen
(74) *Attorney, Agent, or Firm* — DLA Piper LLP (US)

(57) ABSTRACT

A semiconductor device including a multiplicity of large current power elements with each power element divided into a multiplicity of divisional elements and arranged such that the power elements belonging to different power elements are arranged in a repetitive sequential order. The IC chip of the semiconductor device is formed to have output wires extending from the respective divisional elements connected to corresponding output pads without crossing other output wires. Arranged on the IC chip are output bumps in association with the respective output pads. A rewiring layer is provided having output coupling wires for connecting together the bumps that belong to the same power element and connecting them further to an external output electrode.

10 Claims, 11 Drawing Sheets

Related U.S. Application Data application No. 10/962,162, filed on Oct. 8, 2004, now Pat. No. 7,265,395.

(51) Int. Cl.
*H01L 23/538* (2006.01)
*H01L 25/07* (2006.01)
*H01L 23/00* (2006.01)
*H01L 27/06* (2006.01)

(52) U.S. Cl.
CPC ............ *H01L 24/11* (2013.01); *H01L 25/072* (2013.01); *H01L 27/0611* (2013.01); *H01L 2224/05001* (2013.01); *H01L 2224/05027* (2013.01); *H01L 2224/05548* (2013.01); *H01L 2224/06515* (2013.01); *H01L 2924/00014* (2013.01); *H01L 2924/14* (2013.01)

(58) Field of Classification Search
CPC ............... H01L 23/5386; H01L 25/072; H01L 27/0207; H01L 27/0611
USPC .. 257/203, 207, 208, 690, 692, 786, E23.02, 257/E23.079, E23.151, E23.153, E23.175
See application file for complete search history.

(56) References Cited

U.S. PATENT DOCUMENTS

| | | | |
|---|---|---|---|
| 5,292,687 A * | 3/1994 | Isozaki | H01L 23/528 257/786 |
| 5,366,906 A | 11/1994 | Wojnarowski et al. | |
| 5,637,187 A | 6/1997 | Takasu et al. | |
| 5,875,089 A | 2/1999 | Higashide et al. | |
| 5,909,139 A | 6/1999 | Williams | |
| 6,069,838 A | 5/2000 | Jeong | |
| 6,147,918 A | 11/2000 | Takashima et al. | |
| 6,159,841 A * | 12/2000 | Williams | H01L 23/4824 257/E23.015 |
| 6,365,975 B1 | 4/2002 | DiStefano et al. | |
| 6,456,472 B1 * | 9/2002 | Beriault | H02H 9/046 361/56 |
| 6,791,128 B1 | 9/2004 | Yamauchi | |
| 6,963,136 B2 | 11/2005 | Shinozaki et al. | |
| 7,019,337 B2 | 3/2006 | Eden et al. | |
| 2001/0011768 A1 * | 8/2001 | Kohara | H01L 23/50 257/692 |
| 2001/0026008 A1 | 10/2001 | Tsuneda et al. | |
| 2002/0149086 A1 | 10/2002 | Aoki | |
| 2002/0180027 A1 | 12/2002 | Yamaguchi et al. | |
| 2002/0195286 A1 * | 12/2002 | Shirakawa | B60L 11/1803 180/65.1 |
| 2003/0137861 A1 * | 7/2003 | Thies | H01L 23/5286 365/63 |
| 2003/0164738 A1 * | 9/2003 | Wu | H01L 27/0207 330/307 |
| 2003/0170934 A1 | 9/2003 | Lin | |
| 2003/0218246 A1 | 11/2003 | Abe et al. | |
| 2004/0056367 A1 * | 3/2004 | Jassowski | H01L 23/50 257/782 |
| 2005/0110136 A1 * | 5/2005 | Rakshani | H01L 23/50 257/724 |

* cited by examiner

SEMICONDUCTOR DEVICE COMPRISING POWER ELEMENTS IN JUXTAPOSITION ORDER

CROSS-REFERENCE TO RELATED APPLICATIONS

This is a divisional of application Ser. No. 11/778,526, filed on Jul. 16, 2007, which is a continuation of application Ser. No. 10/962,162, filed on Oct. 8, 2004, now U.S. Pat. No. 7,265,395, and claims the benefit of priority under 35 USC 119 of Japanese application no. 2003-358599, filed on Oct. 20, 2003, all of which are incorporated herein by reference.

FIELD OF THE INVENTION

This invention relates to a semiconductor device equipped with a multiplicity of large current power elements (i.e. large capacity power elements) such as power transistors.

BACKGROUND OF THE INVENTION

Some semiconductor devices have a multiplicity of large current power elements such as power transistors arranged in close proximity (see for example Japanese Patent Early Publication No. H7-135299).

These multiple large current power elements are often required to have their relative variations in characteristics reduced. One way to reduce the relative variations is shown in FIG. 8.

Figure 8:
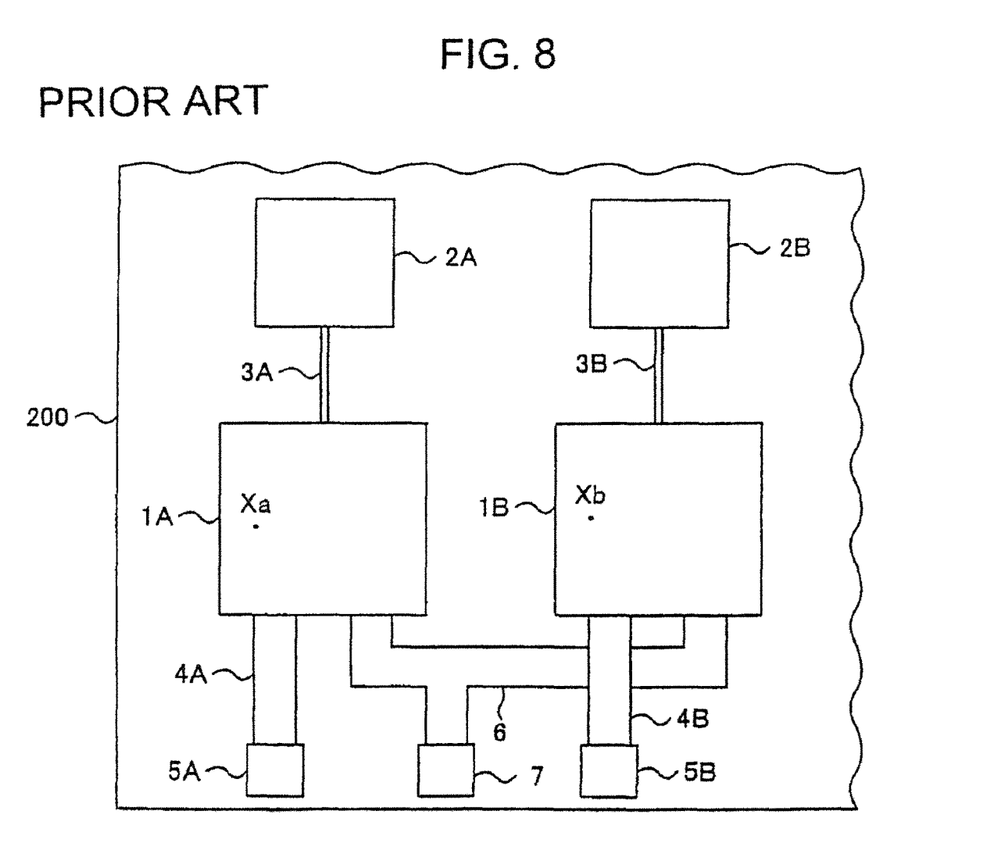
FIG. 8 shows a structure of a conventional IC chip.

FIG. 8 shows an arrangement of a semiconductor integrated circuit 200 having two power transistors 1A and 1B. Operating conditions of the power transistors 1A and 1B are controlled by respective control signals supplied, via signal lines 3A and 3B, from respective control circuits 2A and 2B each having a signal-processing circuit and a pre-drive circuit. The output end of the power transistor 1A is connected to an output pad 5A via an output wire 4A, and the output end of the power transistor 1B to output pad 5B via an output wire 4B. The power input ends of the power transistors 1A and 1B are connected to a common power supply pad 7 via power supply wires 6. The power input end may be alternatively connected to the ground. In this case, the power input ends serve as grounding ends, the power supply wires 6 as grounding wires, and the power supply pad 7 as a grounding pad. This applies to the rest of the examples shown below.

In the conventional semiconductor device 200, the power transistors 1A and 1B are arranged as close as possible to each other. However, no matter how closely the power transistors 1A and 1B are arranged to each other, corresponding portions of the power transistors 1A and 1B (indicated by Xa and Xb in FIG. 8 for example) will be separated by an appreciable distance, since the power transistors 1A and 1B themselves have large areas. In addition, the semiconductor substrate in which the power transistors 1A and 1B are built has impurity gradient induced during its manufacture. Variations in characteristics of the power transistors 1A and 1B due to the impurity gradient and distance are unavoidable. Similarly, variations in the characteristics due to a temperature gradient created in the semiconductor substrate during operation are unavoidable.

SUMMARY OF THE INVENTION

It is therefore an object of the invention to provide a semiconductor device including a multiplicity of large current power elements such as power transistors whose relative variations in characteristics are small.

It is another object of the invention to provide a semiconductor device including a multiplicity of large current power elements whose relative variations in characteristics are small and having output wires connecting the power elements without crossing one another to reduce their layout area.

A semiconductor device in accordance with one embodiment of the invention includes a multiplicity N (N≥2) of semiconductor power elements adapted to perform N different operations, wherein each of the N power elements is divided into M (M≥2) divisional elements and N×M divisional elements are arranged such that divisional elements belonging to different power elements are sequentially arranged in juxtaposition. The semiconductor device further comprises N output pads in association with the N power elements, and output wires for connecting the divisional elements that belong to a respective semiconductor power element to an output pad associated with power element.

The semiconductor device may be provided with power supply wires or grounding wires for connecting the N×M divisional elements to at least one power supply pad or one grounding pad, respectively, wherein the power supply wires and grounding wires are formed using a wiring layer different from the wiring layer for the output wires.

A semiconductor device in accordance with another embodiment of the invention comprises:

a semiconductor integrated circuit (IC) body including
a multiplicity N (N≥2) of semiconductor power elements adapted to perform N different operations with each power element divided into M (M≥2) divisional elements and with N×M divisional elements arranged such that divisional elements belonging to different power elements are sequentially arranged in juxtaposition, and
output wires for connecting the N×M divisional elements to associated N×M output pads without crossing one another; and
a rewiring layer provided on the IC body and having
output bumps electrically connected to the respective N×M output pads to retrieve the outputs of the N×M divisional elements, and
output coupling wires, provided on an insulating layer formed on the IC body, for connecting together the output bumps that belong to the same power element, the output coupling wires further connecting to an external output electrode for connection with an external device.

The IC body may have power supply wires or grounding wires for connecting the N×M divisional elements to at least one power supply pad or one grounding pad, the power supply wires and grounding wires formed using a wiring layer different from the wiring layer for the output wires.

The IC body may have power supply wires or grounding wires for connecting the N×M divisional elements to at least one power supply pad or a grounding pad. The rewiring layer may be provided with a power supply bump or a grounding bump for electrical connection with the power supply pad or the grounding pad. The power supply pad or the grounding pad is connected to an external power supply electrode or external grounding electrode.

The power supply wires or grounding wires are arranged not to cross any of the output wires on the same plane.

Each of the N×M output pads may be arranged at an angular position relative to the divisional element associated with the output pad, the angular position being unique to the divisional elements that belong to the same power element and different from the angular positions of divisional elements belonging to other power elements.

Each of the N×M power supply pads or grounding pads may be arranged at an angular position relative to the divisional element associated with the power supply pad or grounding pad, the angular position being unique to the divisional elements that belong to the same group and different from the angular positions of the output pads.

The output coupling wires may be formed of the same material as the output bumps after the output bumps and the insulating layer are formed.

The external output electrode may be a ball electrode.

As described above, the inventive semiconductor device has a multiplicity of large current power element such as power transistors, with each power element divided into a multiplicity of divisional elements, wherein the divisional elements belonging to different power elements are sequentially arranged in juxtaposition to reduce relative variations of the characteristics of the power elements.

According to the invention, in a semiconductor device having a multiplicity of large current power elements such as power transistors with each power element divided into multiple groups of divisional elements and with divisional elements belonging to different power elements are sequentially arranged in juxtaposition, and in such semiconductor device, output wires of the divisional elements are arranged not to cross one another. This arrangement enables reduction of the layout area of the power elements, along with the reduction of the relative variations of the characteristics of the power elements.

The IC body of inventive semiconductor device including a multiplicity of semiconductor power elements is provided thereon with a rewiring layer having output coupling wires for connecting together divisional elements belonging to the same power element. Accordingly, the semiconductor device of the invention can be used in the same way as an ordinary semiconductor IC.

DETAILED DESCRIPTION OF THE PREFERRED EMBODIMENTS

The inventive semiconductor device will now be described in detail by way of example with reference to the accompanying drawings.

Figure 1:
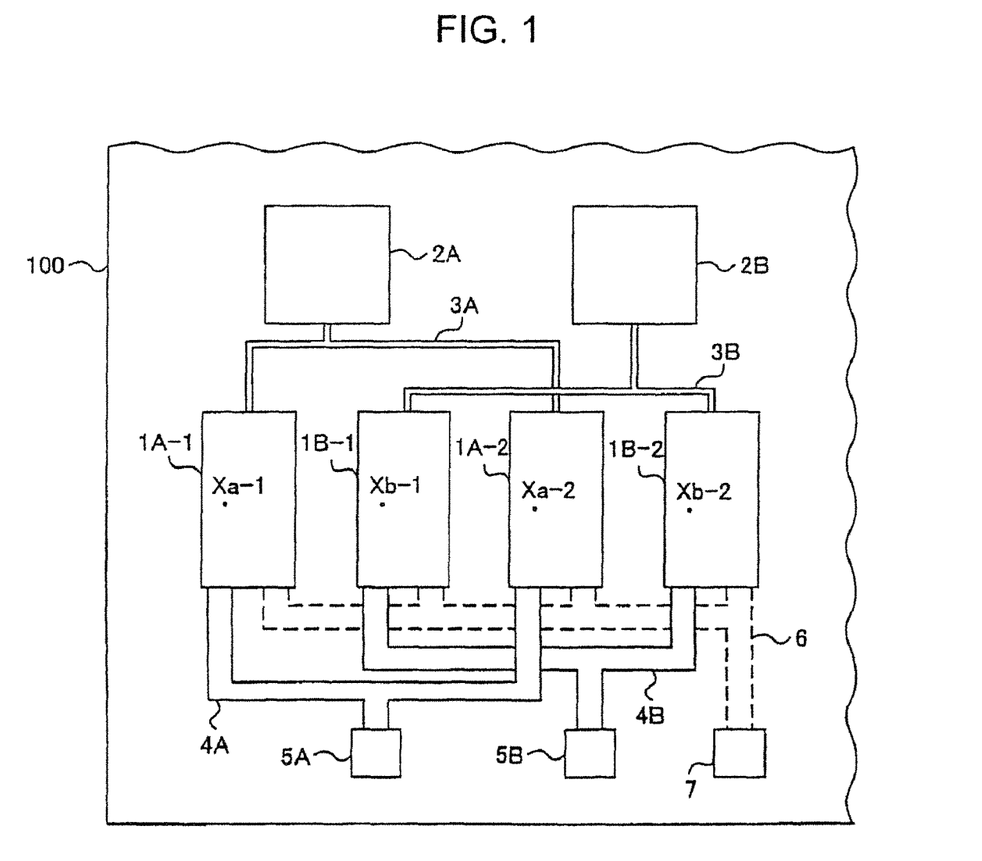
FIG. 1 shows a structure of the IC chip according to a first embodiment of the invention.

FIG. 1 shows a structure of the semiconductor device according to a first embodiment of the invention, which includes a multiplicity of power elements adapted to perform different operations and provide their own outputs. To reduce relative variations in characteristics of the power elements, each power element is divided into a multiplicity of divisional elements and arranged in such a way that divisional elements that belong to different power elements are arranged in juxtaposition and in a repetitive sequential order. Of course, the power elements can be configured to operate simultaneously. These features are common in any of the embodiments of the invention described below.

FIG. 1 shows a structure of a semiconductor integrated circuit (hereinafter referred to as IC chip) 100 having two power transistors 1A and 1B consisting of divisional elements 1A-1 and 1A-2 and divisional elements 1B-1 and 1B-2, respectively. The divisional elements belonging to the power transistors 1A and 1B are arranged in juxtaposition in the order of 1A-1, 1B-1, 1A-2, and 1B-2, as shown.

The two divisional elements 1A-1 and 1A-2 are connected together by a signal wire 3A and an output wire 4A to form the power transistor 1A. The two divisional elements 1B-1 and 1B-2 are connected together by a signal wire 3B and an output wire 4B to form the power transistor 1B. Power supply wires 6, shown by phantom lines, are formed using a wiring layer different from the wiring layer for the output wires 4A and 4B, and connected to all the divisional elements 1A-1-1B-2. The output wires 4A and 4B are respectively connected to output pads 5A and 5B, and the power supply wires 6 are connected to a power supply pad 7. Other features of the IC chip of FIG. 1 are the same as those of FIG. 8. It should be understood that the power supply wires shown by dashed lines in any other embodiment are also formed using a different wiring layer than the wiring layer for the output wires.

In the IC chip 100, the divisional element 1A-1 or 1A-2 belonging to the power transistor 1A and the divisional element 1B-1 or 1B-2 belonging to the power transistor 1B are arranged in juxtaposition. As a result, the distance between two corresponding portions (e.g. between portions Xa-1 and Xb-1, and between Xa-2 and Xb-2 of FIG. 1) becomes approximately one half the conventional distance between them. Now variations in characteristics of the two transistors exist between two correspondence portions of the elements, for example between Xa-1 and Xb-1 and between Xa-2 and Xb-2. Thus, the variations in the characteristics of the power transistors 1A and 1B are reduced accordingly.

In the first embodiment, however, although the variations in the characteristics are improved, improvement is not satisfactory regarding the following points. In the first embodiment, the output wires 4A and 4B extending from the divisional elements 1A-1-1B-2 are preferably connected to the output pads 5A and 5B with as small variation in resistance as possible. In doing so, if the output pads arranged in the same angular position relative to the respective divisional elements, the output wires 4A and 4B connected to the output pads will cross each other if the same wiring layer is used. Moreover, if the power supply wires 6 are provided using the same wiring layer, they will cross the output wires 4A and 4B. Furthermore, the output wires 4A and 4B and the power supply wires 6 are required to have sufficient widths in order to suppress on-resistances of the power elements. However, since the wiring distances of the wires increase when such crossing of wires takes place, the widths of the lead wires must be increased to keep the on-resistances suppressed. Hence, when the output wires 4A and 4B and the power supply wires 6 are arranged in the regions between the divisional elements 1A-1-1B-2 and the output pads 5A and 5B, or between the divisional elements 1A-1-1B-2 and the power supply pad 7 as shown in FIG. 1, a large wiring area is needed in the region, thereby lowering the layout efficiency.

Figure 2A:
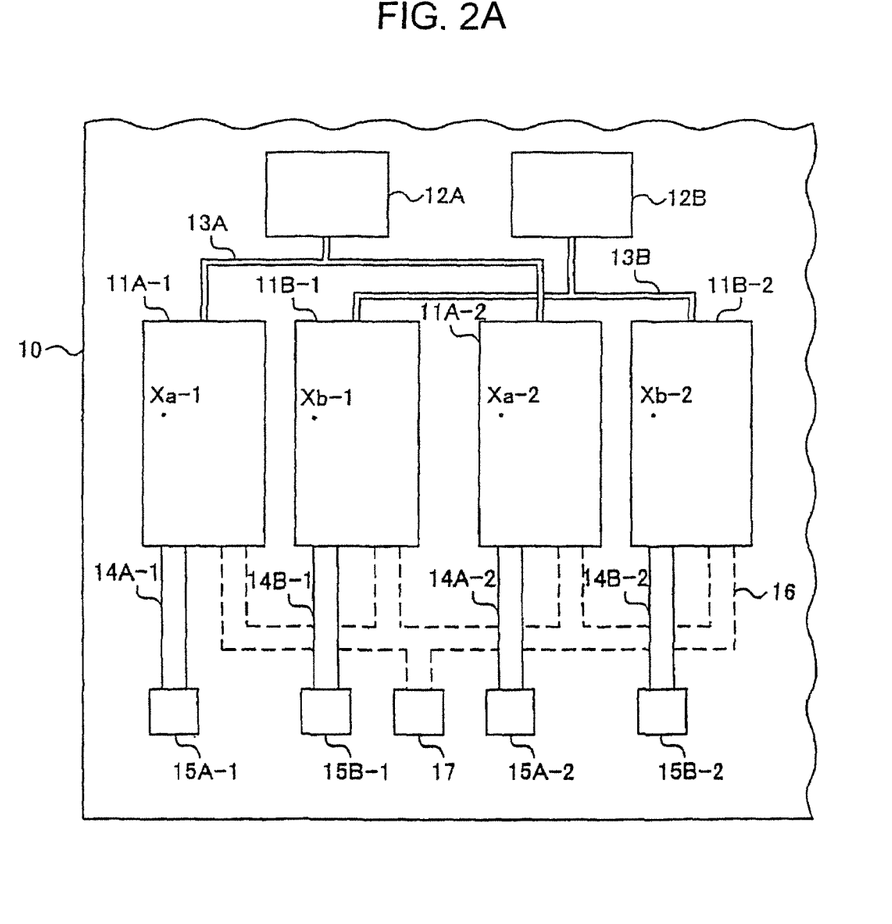
FIG. 2A shows a structure of the IC chip body according to a second embodiment of the invention.
Figure 2B:
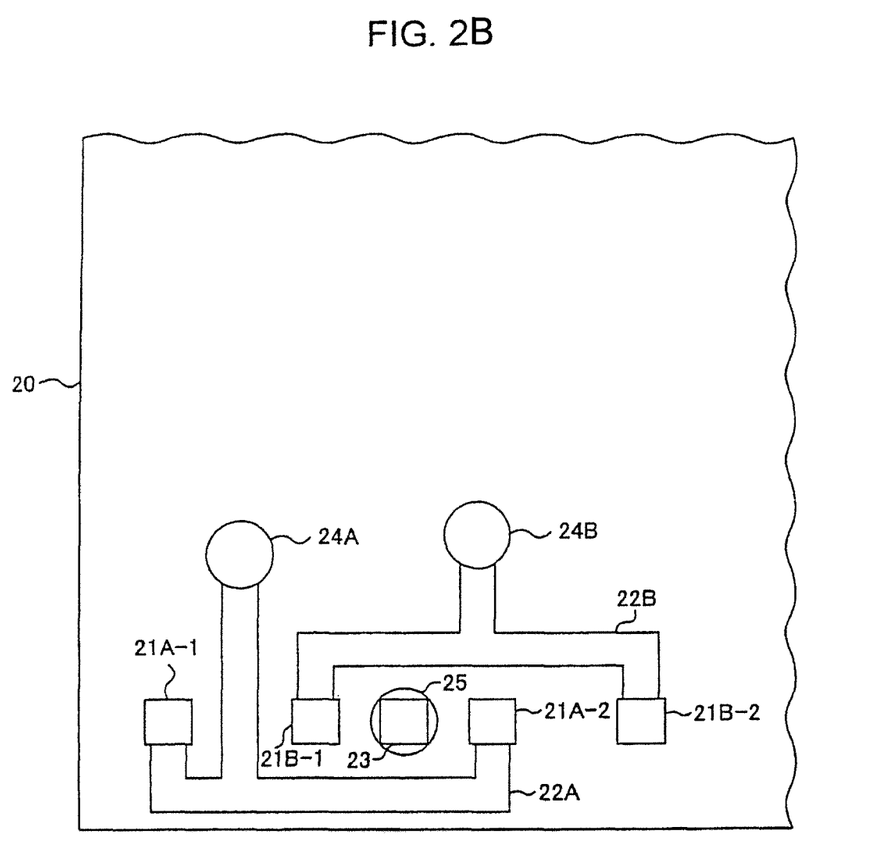
FIG. 2B shows a structure of the rewiring layer formed on the IC chip body of the second embodiment.
Figure 3:
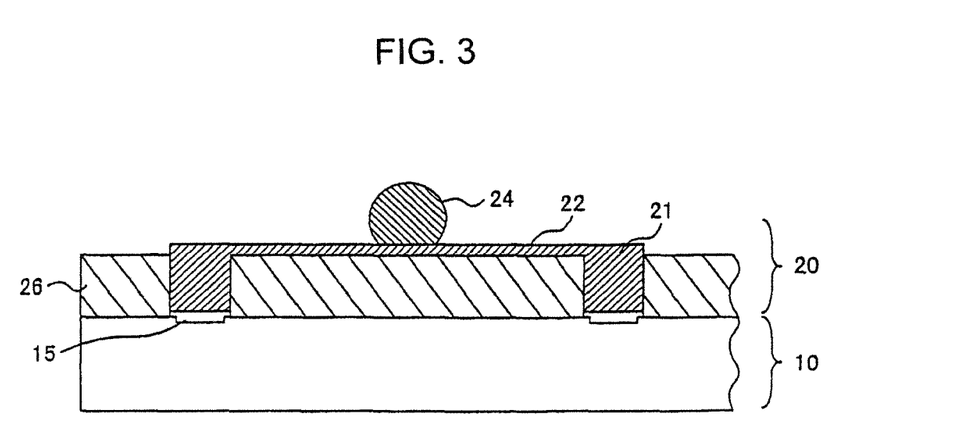
FIG. 3 shows a schematic sectional view illustrating a structure of the semiconductor device according to the second embodiment.

FIGS. 2A and 2B together show a structure of the semiconductor device according to a second embodiment of the invention configured to reduce the relative variations in characteristics of the power elements while suppressing the layout area therefor. FIG. 3 is a schematic sectional view of a semiconductor device of the second embodiment.

FIG. 2A particularly shows the structure of a semiconductor integrated circuit (referred to as IC chip body) according to the invention. FIG. 2B particularly shows the structure of a rewiring layer formed on the IC chip body. In the following embodiments, power elements are supposed to be power transistors. However, the invention may be applied to other power elements other than power transistors in reducing their relative variations in characteristics.

In the example shown in FIG. 2A, each of the N (N=2) power transistors 11A and 11B consists of two divisional elements (M=2). The multiple divisional elements 11A-1, 11B-1, 11A-2, and 11B-2 of the power transistors 11A and 11B are arranged in juxtaposition in the order mentioned. The two divisional elements 11A-1 and 11A-2 are controlled by the control signal supplied from a control circuit 12A via a signal wire 13A. That is, the divisional elements 11A-1 and 11A-2 are driven together as a unified power transistor 11A. The two divisional elements 11B-1 and 11B-2 are controlled by a control signal supplied from a control circuit 12B via a signal wire 13B. That is, the divisional elements 11B-1 and 11B-2 are driven together as a unified power transistor 11B.

The output wires 14A-1, 14B-1, 14A-2, and 14B-2 of the divisional elements 11A-1 1-B-2 are respectively connected to output pad 15A-1, 15B-1, 15A-2, and 15B-2.

Moreover, power supply wires 16 extending from the divisional elements 11A-1-11B-2 are connected to a common power supply pad 17 using a wiring layer different from the wiring layer for the output wires 14A-1-14B-2. Incidentally, the "power supply" can alternatively be replaced by the "ground." In this case, the power supply pad 17 is grounded, and the power supply wire 16 is rephrased as the grounding wire 16 and the power supply pad 17 as the grounding pad 17. This applies to other embodiments of the invention.

In the IC chip body 10, the divisional elements 11A-1 and 11A-2 belonging to the power transistor 11A and the divisional elements 11B-1 and 11B-2 belonging to the power transistor 11B are arranged in close proximity. The corresponding portions (as marked as Xa-1 and Xb-1, and Xa-2 and Xb-2 in FIG. 2A) have short distances. That is, variations in characteristics of the two transistors exist between two correspondence portions of the elements, for example between Xa-1 and Xb-1 and between Xa-2 and Xb-2.

In the IC chip 10, output wires 14A-1-14B-2 extending from the divisional elements 11A-1-11B-2 are directly connected to the output pads 15A-1-15B-2. That is, the output wires 14A-1-14B-2 do not cross each other. Thus, on-resistances of the power transistors 11A and 11B including resistances of the wiring resistances can be minimized.

It is noted that the output wires 14A-1-14B-2 cross the power supply wires 6. However, in the IC chip body 10, crossing does not matter, since the electric conduction layer for the output wires and that for the power supply wire are formed using different wiring layers.

In a rewiring layer 20 formed on the IC chip body shown in FIG. 2B, output bumps (or output posts) 21A-1, 21B-1, 21A-2, 21B-2, and a power supply bump (or power supply post) 23 are provided in contact with corresponding output pads 15A-1, 15B-1, 15A-2, and 15B-2 and with a corresponding power supply pad 17, respectively. An insulating layer of polyimide resin for example is provided on the surface of the IC chip body 10 excluding the areas of the pads. This insulating layer may have a thickness comparable with the heights of the output bumps 21A-1-21B-2 and the power supply bump 23.

The output bumps 21A-1-21A-2 associated with the power transistor 11A are connected together by an output coupling wire 22A, which is extended to a position where it is connected to an external output electrode 24A. The bumps 21B-1 and 21B-2 associated with the power transistor 11B are connected together by an output coupling wire 22B, which is extended to a position where it is connected to an external output electrode 24B. The power supply bump 23 is connected to a power supply bump electrode 25. It is noted that in this rewiring layer 20 the output coupling wires 22A and 22B do not cross each other or cross any other lead wires. Therefore, the output coupling wires can be formed with sufficient widths in one layer to minimize their resistances.

It is noted that the external output electrodes 24A and 24B can alternatively be provided directly on the respective bumps 21A-1 and 21A-2 or on the respective bumps 21B-1 and 21B-2.

The output coupling wires 22A and 22B are formed after the output bumps 21A-21B and the insulating layer are formed. The output coupling wires 22A and 22B are preferably formed of the same material, and formed to have the same thickness and the same length as the bumps. The external output electrodes 24A and 24B and the power supply bump electrode 25 may be provided in the form of, for example, ball electrodes and a bump electrode, respectively.

FIG. 3 is a schematic sectional view illustrating the structure of the semiconductor device shown in FIGS. 2A and 2B, with alphabets A and B omitted from the symbols.

As shown in FIG. 3, each of the constituent elements of FIG. 2A is built in the IC chip body 10. Formed on the surface of the IC chip body 10 are the output pads 15. The bumps (or posts) 21 are formed to be in electrical contact with the output pads 15. An insulating layer 26 is formed on the surface of the IC chip body 10 excluding the areas of the bumps. Next, a predetermined set of the bumps 21 is connected together by an output coupling lead wire 22, to which an external output electrode 24 is connected.

In accordance with the second embodiment, each of the multiple power elements 11A and 11B is constituted of a multiplicity of divisional elements 11A-1-11B-2. The divisional elements belonging to different power elements are sequentially arranged in juxtaposition to thereby reduce relative variations in the characteristics of the power elements. Moreover, crossing of the output wires 14A-1-42B-2 is eliminated to suppress their layout area. In addition, only one rewiring layer 20 is used to provide the non-crossing output coupling wires 22A and 22B. Furthermore, since the rewiring layer 20 is formed to have the output coupling wires 22A and 22B that connect together the divisional elements associated with the same power element 11A or 11B, the semiconductor device of the invention can be used as an ordinary IC chip.

Figure 4:
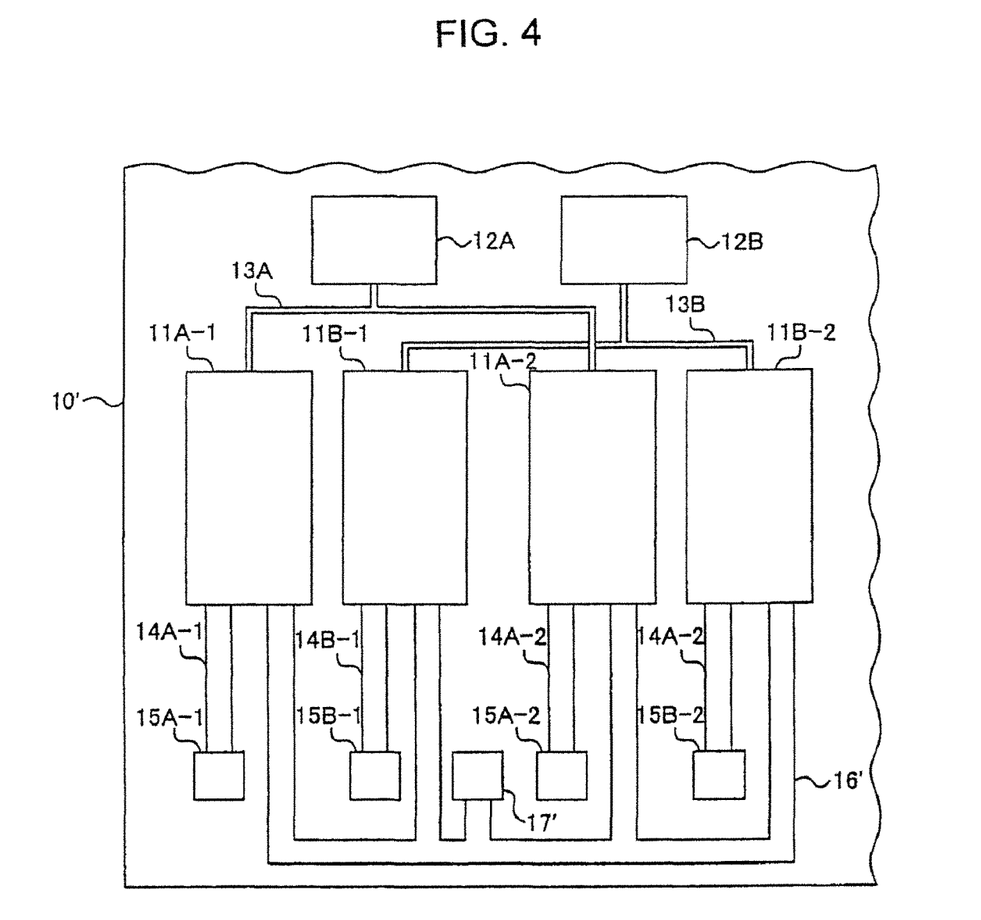
FIG. 4 shows a structure of the IC chip body according to a third embodiment of the invention.

FIG. 4 shows a structure of an IC chip body 10' of the semiconductor device according to a third embodiment of the invention.

In the IC chip body 10' of FIG. 4, a power supply wire 16' connecting the divisional elements 11A-1-11B-2 to a power supply pad 17' is arranged on the same plane without crossing any of the output wires 14A-1-14B-2. Thus, the output wires 14A-1-14B-2 and the power supply wire 16' can be formed using the same wiring layer. Other features of the arrangement of FIG. 4 are the same as for the IC chip body 10 of FIG. 2A.

Formed on the IC chip body 10' is the same rewiring layer 20 as shown in FIG. 2B.

In accordance with the third embodiment, although the length of the power supply wire 16' becomes larger as compared with that of the second embodiment, the power supply wire 16' can be formed together with the output wires 14A-1-14B-2 using the same wiring layer. The third embodiment can provide the same results as the second embodiment.

Figure 5A:
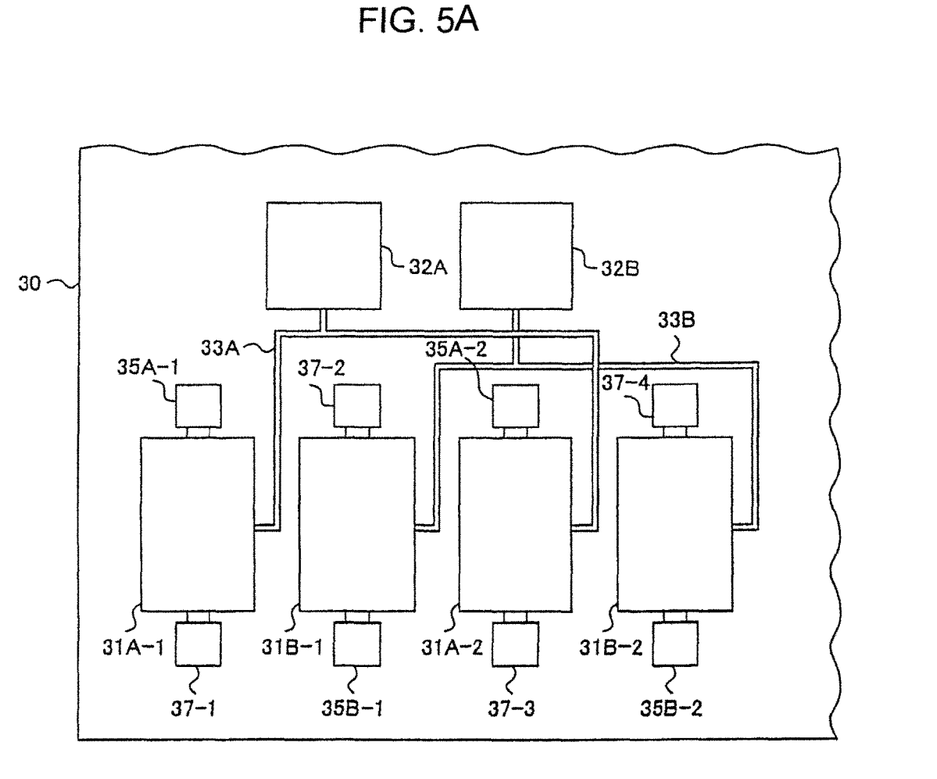
FIG. 5A shows a structure of the IC chip body according to a fourth embodiment of the invention.
Figure 5B:
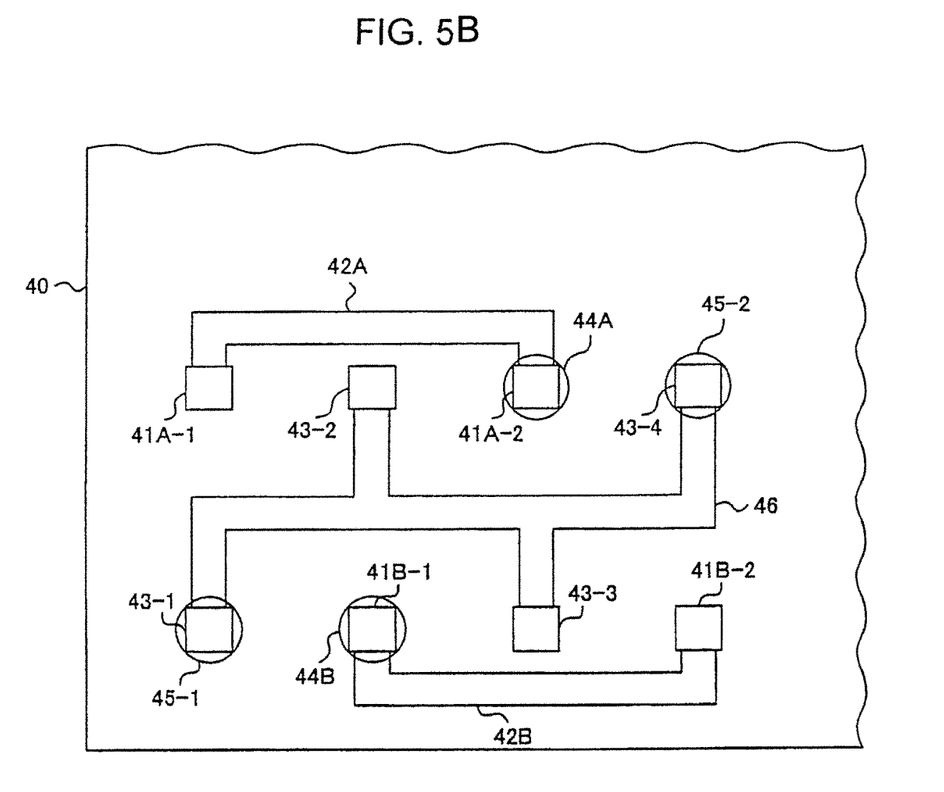
FIG. 5B shows a structure of the rewiring layer formed on the IC chip body of the fourth embodiment.

FIGS. 5A and 5B together show a structure of the semiconductor device according to a fourth embodiment of the invention. Particularly, FIG. 5A illustrates the structure of an IC chip body 30, and FIG. 5B the structure of a rewiring layer 40 formed on the IC chip body 30.

FIG. 5A shows an exemplary IC chip body 30 constituted of two power transistors 31A and 31B (N=2) each divided into two divisional elements (M=2). The multiple divisional elements 31A-1, 31B-1, 31A-2, and 31B-2 making up the power transistors 31A and 31B are arranged in juxtaposition in the order mentioned. The two divisional elements 31A-1 and 31A-2 are controlled by a control signal supplied from a control circuit 32A via a signal wire 33A.

The output pad 35A-1 and 35A-2 associated with the divisional elements 31A-1 and 31A-2 of the power transistor 31A are provided in proximity to the upper ends of the respective divisional elements, as shown. Power supply pads 37-1 and 37-3 are provided in proximity to the lower ends of the respective divisional elements, as shown. The output pads 35B-1 and 35B-2 associated with the divisional elements 31B-1 and 31B-2 are provided in proximity to the lower ends of the respective divisional elements, as shown. The power supply pads 37-2 and 374 are provided in proximity to the upper ends of the respective divisional elements, as shown. Two sets of the divisional elements 31A-1 and 31A-2 and of divisional elements 31B-1 and 31B-2 are respectively supplied with control signals from control circuits 32A and 32B via signal wires 33A and 33B. Thus, the divisional elements 31A-1 and 31A-2 are driven together as one power transistor 31A, and so are the divisional elements 31B-1 and 31B-2 driven as one transistor 31B.

In this manner, the four (N×M) divisional elements 35A-1-35B-2 are provided with respective power supply pads 37-1-374 and output pads 35A-1-35B-2. These power supply pads 37-1-37-4 and output pads 35A-1-35B-2 are connected to the divisional elements by the respective power supply wires and by the respective output wire (reference number omitted in FIG. 5A).

The four (N×M) output pads 35A-1-35B-2 are arranged in such a way that two of them associated with the divisional elements 31A-1 and 31A-2 belonging to the same power element 31A are each arranged at an angular position (e.g. upper position) relative to the associated divisional element as shown, while two of them associated with the divisional elements 31B-1 and 31B-2 belonging to the same power element 31B are each arranged at another angular position (e.g. lower position) relative to the associated divisional element as shown.

The four (N×M) power supply pads 37-1-37-4 are arranged in such a way that two of them associated with the divisional elements 31A-1 and 31A-2 belonging to the same power element 31A are each arranged at an angular position (e.g. lower position) relative to the associated divisional element as shown, while two of them associated with the divisional elements 31B-1 and 31B-2 belonging to the same power element 31B are each arranged at another angular position (e.g. upper position) relative to the associated divisional element.

Thus, the output wires and the power supply wires can be arranged in considerably short length without crossing one another by arranging the output pads 35A-1-35B-2 and the power supply pads 37-1-37-4 in the configuration as described above.

In the rewiring layer 40 of FIG. 5B formed on the IC chip body, the output bumps 41A-1, 41B-1, 41A-2, and 41B-2 and the power supply bumps 43-1-43-4 are respectively provided on the IC chip body 30 in electrical contact with the corresponding output pads 35A-1, 35B-1, 35A-2, and 35B-2 and the corresponding power supply pads 37-1 to 37-4. An insulating layer is provided on the surface of the IC chip body 30 excluding the areas of the bumps.

The output bumps 41A-1 and 41A-2 associated with the power transistor 31A are connected together by an output coupling lead wire 42A, which is extended to a point where it is connected to an external output electrode 44A. The bumps 41B-1 and 41B-2 associated with the power transistor 31B are connected together by an output coupling wire 42B, which is extended to a point where it is connected to an external output electrode 44B. The power supply bumps 43-1-43-4 are connected together by a power coupling wire 46, which is extended to a point where it is connected to an external device.

Power supply electrodes 45-1 and 45-2 are connected to the power coupling wire 46 at two points, which are, in the example shown herein, the power supply bumps 43-1 and 43-4. In this rewiring layer 40, there is no crossing between the output coupling wires 42A and 42B nor between the output coupling wires and the power coupling wire 46. Therefore, the output coupling wires 42A and 42B and the power coupling wire 46 can be implemented by one electric conduction layer. Other features of this semiconductor device are the same as those of the second and the third embodiments described above.

It is noted that in the fourth embodiment output wires and power supply wires never cross one another, that their lengths can be very short, and that the same results can be attained as in the second embodiment.

Figure 6A:
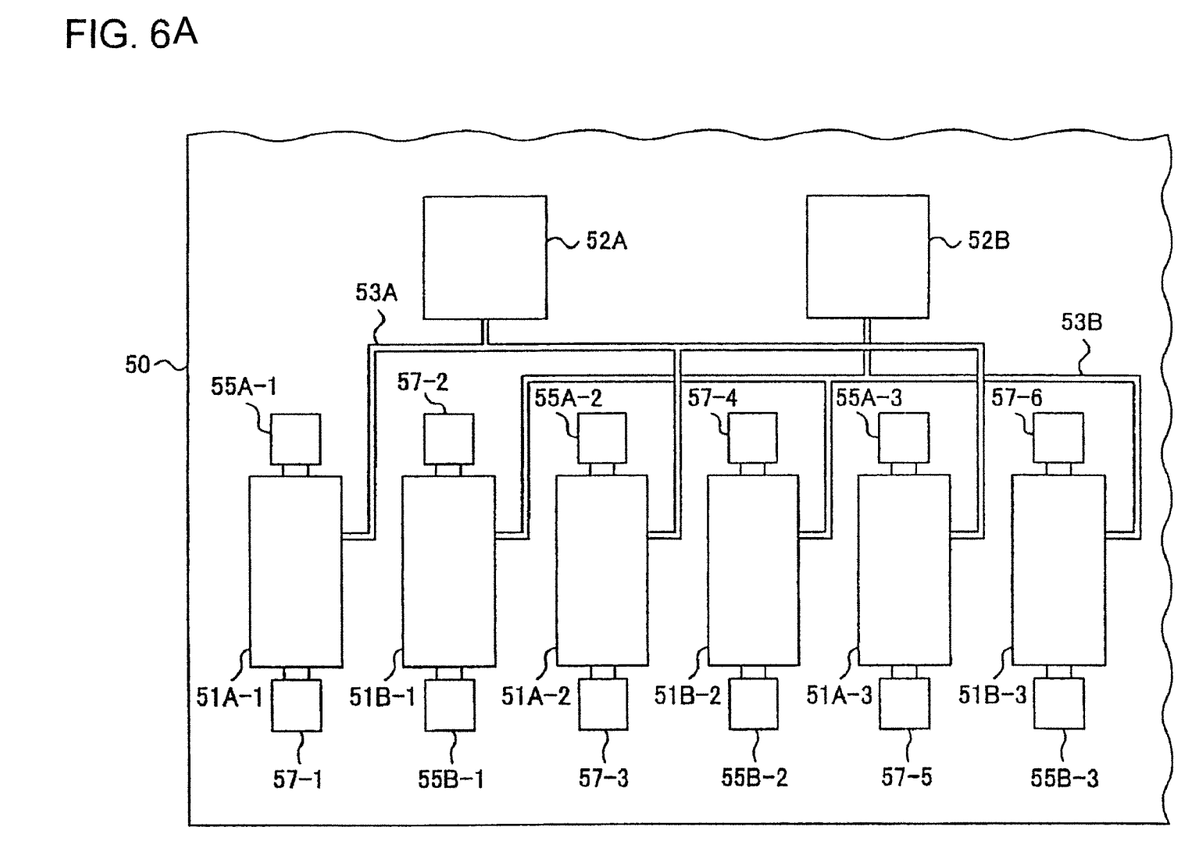
FIG. 6A shows a structure of the IC chip body according to a fifth embodiment of the invention.
Figure 6B:
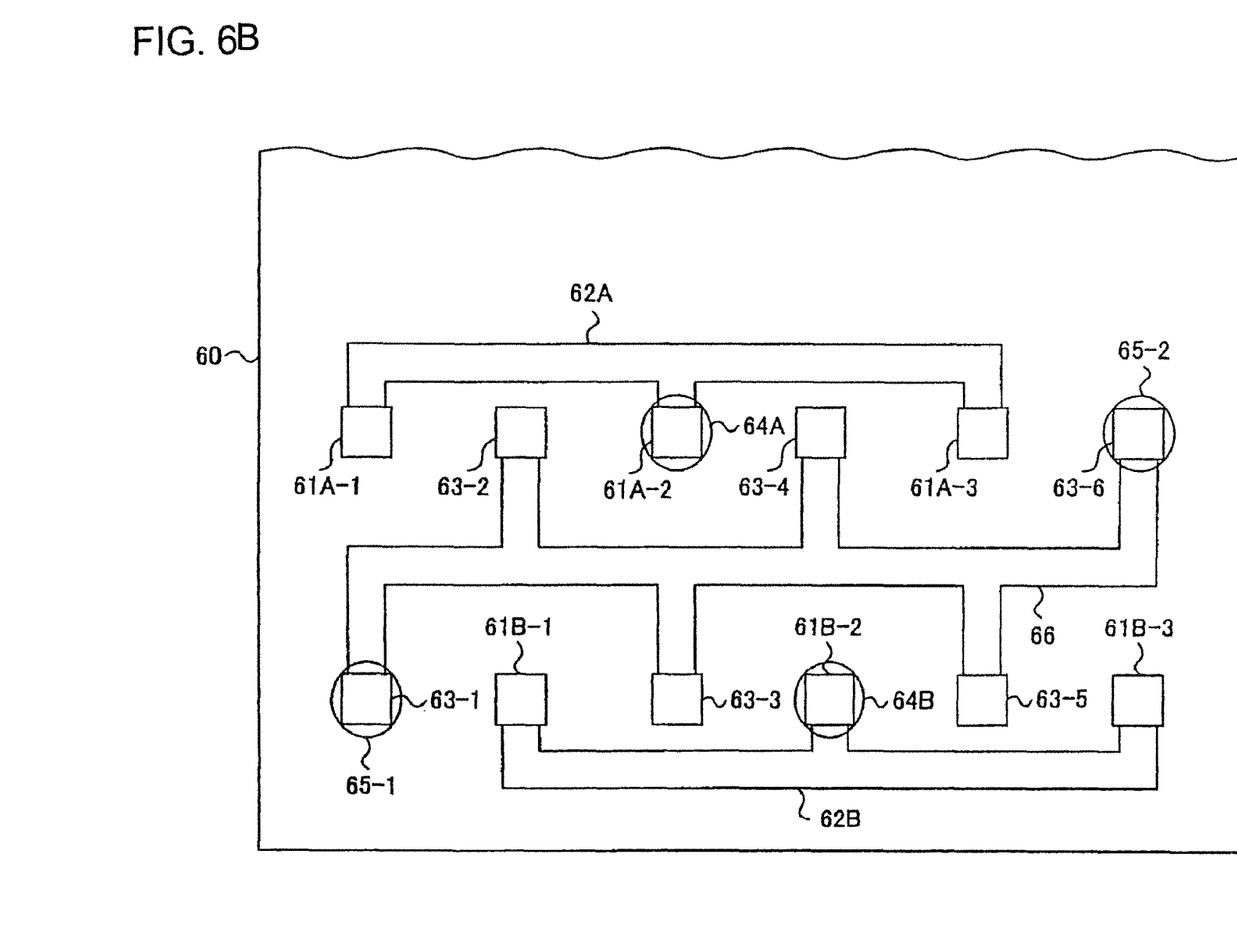
FIG. 6B shows a structure of the rewiring layer formed on IC chip body of the fifth embodiment.

FIGS. 6A and 6B together show a structure of the semiconductor device according to a fifth embodiment of the invention. Particularly, FIG. 6A shows an exemplary structure of an IC chip body 50, and FIG. 6B shows an exemplary structure of a rewiring layer 60 formed on the IC chip body 50.

The IC chip body 50 shown in FIG. 6A consists of two power transistors 51A and 51B each divided into three divisional elements (N=2, M=3). The rewiring layer 60 of FIG. 6B formed on the IC chip body 50 is structured to correspond to the three divisional elements of the respective power transistors. The IC chip body 50 of FIG. 6A and the rewinding layer 60 of FIG. 6B have the same structures as those of the fourth embodiment shown in FIGS. 5A and 5B except for the power transistors each divided into three divisions. Elements are denoted by numerals of 50's in FIG. 6A and 60's in FIG. 6B.

More particularly, symbols 51A-1-51B-3 indicate the respective divisional elements of the power transistors 51A and 51B; symbols 52A and 52B, control circuits; symbols 53A and 53B, signal wires; symbols 55A-1-55B-3, output pads; and symbols 57-1-57-6, power supply pads. Further symbols 61A-1-61B-3 indicate output bumps; symbols 62A and 62B, output coupling wires; symbols 63-1-63-6, power supply bumps; symbols 64A and 64B, external output electrodes; symbols 65-1 and 65-2, external power supply electrodes; and symbol 66, power supply coupling wires.

In the fifth embodiment, multiplicity M of divisional elements per power element can be increased while attaining the same results as the fourth embodiment.

Figure 7A:
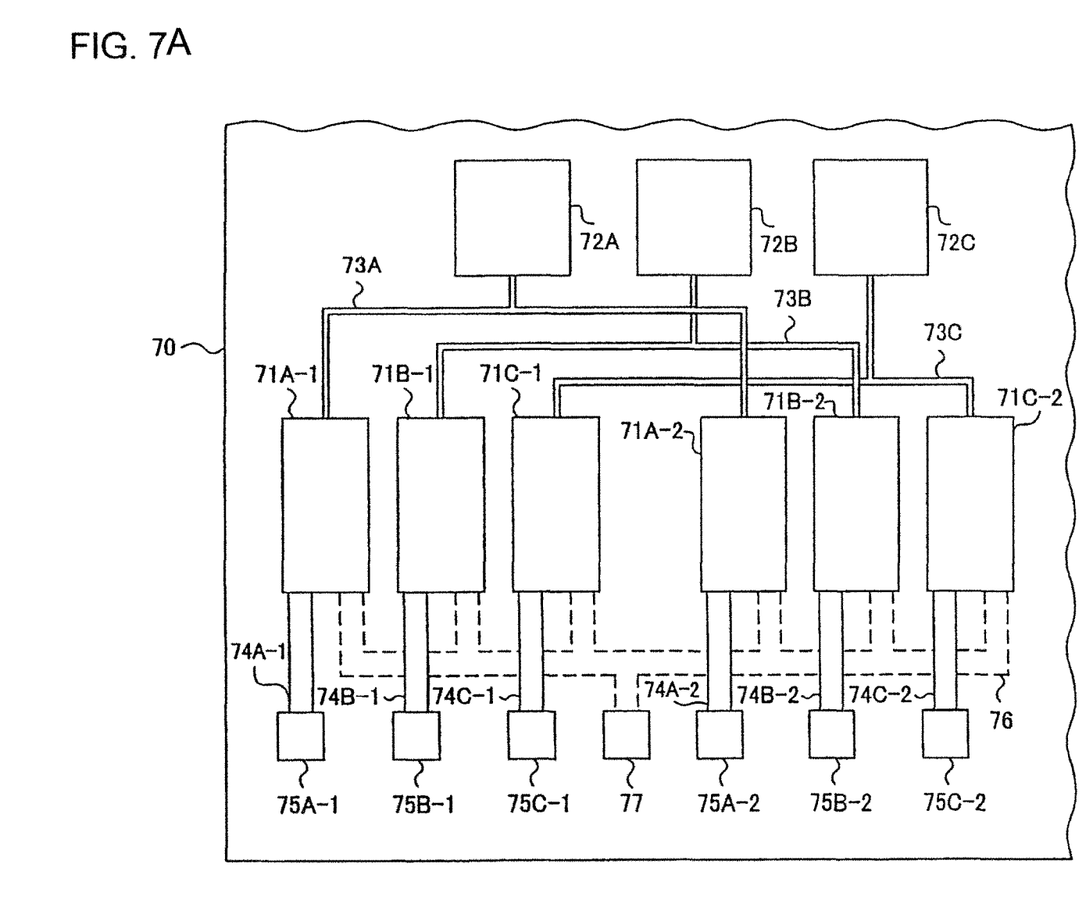
FIG. 7A shows a structure of the IC body according to a sixth embodiment of the invention.
Figure 7B:
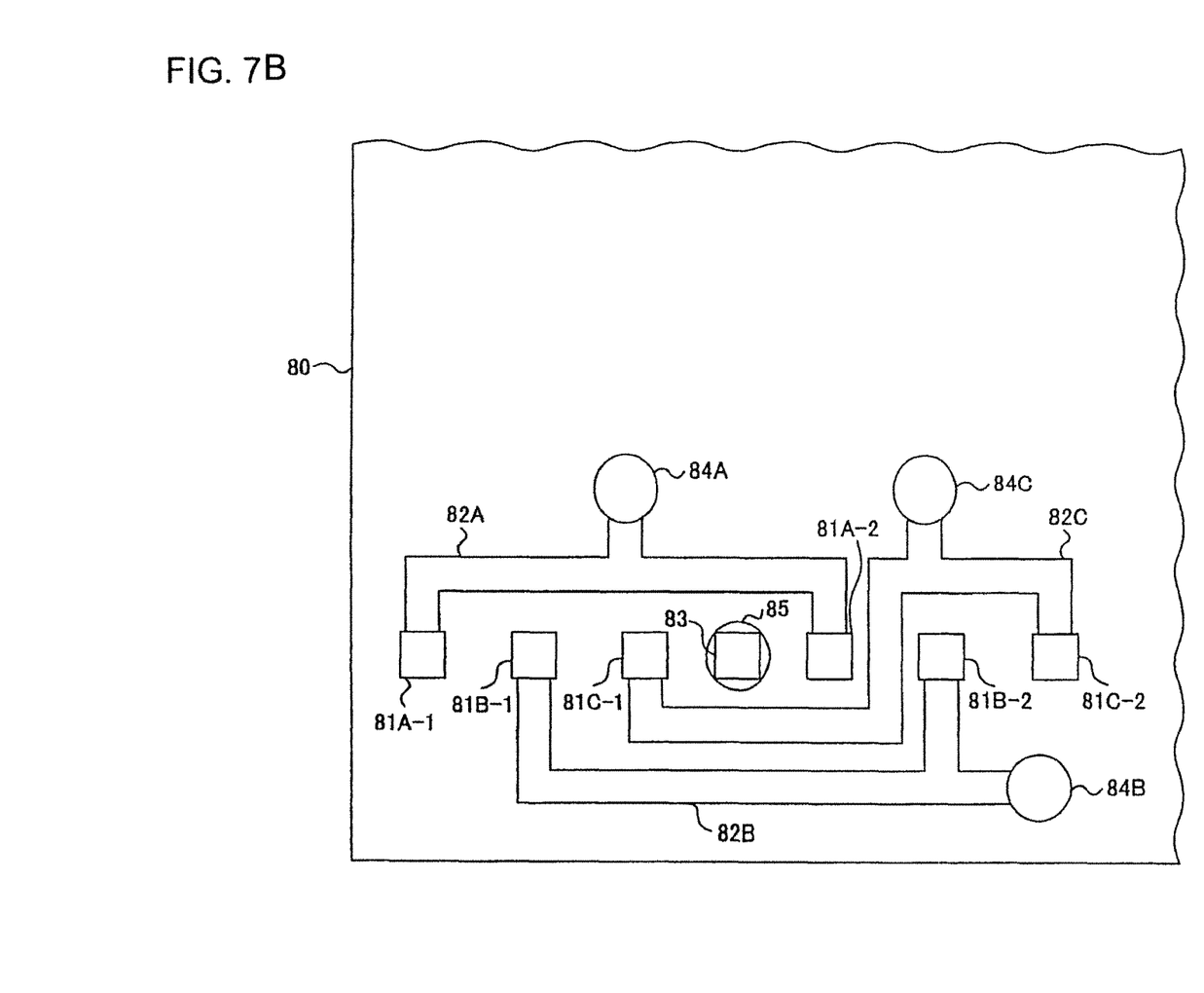
FIG. 7B show a structure of the rewiring layer formed on the IC chip body of the sixth embodiment.

FIGS. 7A and 7B show the structure of a semiconductor device according to a sixth embodiment of the invention. Particularly, FIG. 7A shows the structure of an IC chip body 70, and FIG. 7B shows the structure of a rewiring layer 80 foamed on the IC chip body 70.

In the example shown in FIG. 7A, the IC chip body 70 has three power transistors 71A, 71B, and 71C each consisting of two divisional elements (N=3, M=2). The rewiring layer 80 formed on the IC chip body of FIG. 7B is structured to correspond to the two divisional elements of the respective power transistors of the IC chip body 70. The IC chip body 70 and the rewinding layer 80 have the same structures as those of the second embodiment shown in FIGS. 2A and 2B except for the three power transistors each being divided into two divisional elements denoted by numerals of 70's in FIG. 7A and 80's in FIG. 7B.

More particularly, symbols 71A-1-71C-2 denote the respective divisional elements of the power transistors 71A, 71B, and 71C; symbols 72A, 72B, and 72C, control circuits; symbols 73A, 73B, and 73C, signal wires; symbols 74A-1-74C-2, output wires; symbols 75A-1-75C-2, output pads; symbols 76, power supply wires; and symbol 77, power supply pad. Further symbols 81A-1-81C-2 denote output bumps; symbols 82A, 82B, and 82C, output coupling wires; symbols 83, a power supply bump; symbols 84A, 84B, and 84C, external output electrodes; and symbols 85, an external power supply electrode.

In this sixth embodiment, output wires can connect the respective blocks on the same plane without crossing one another if the number N of power elements is increased, thereby providing the same results as the preceding embodiments.

Although the invention has been described above only for the cases with M≤3 or N≤3, it will be apparent that the invention can be extended to cases with M>3 and N>3, facilitating minimization of wiring resistance and a wiring space in a semiconductor device.

What I claim is:

1. A semiconductor device comprising:
    N (N≥2) semiconductor power elements each comprising M (M≥2) divisional elements, said semiconductor device thus comprising a total of N×M divisional elements, which are arranged such that divisional elements belonging to different ones of said N semiconductor power elements are arranged in juxtaposition and in a repetitive sequential order;
    N control circuits each being common to said M divisional elements of said respective N semiconductor power elements;
    N×M output pads associated with said N×M divisional elements;
    N×M output wires for connecting each of said N×M divisional elements to associated one of said N×M output pads;
    N×M power supply pads associated with said N×M divisional elements; and
    N×M power supply wires for connecting each of said N×M divisional elements to associated one of said N×M power supply pads, wherein
    said N×M divisional elements are arranged along a first direction,
    said N×M output pads and said N×M power supply pads are arranged along a second direction perpendicular to the first direction such that said output pads and said power supply pads are located at opposite sides of corresponding ones of said divisional elements respectively, and wherein
    a first side of one divisional element of two neighboring divisional elements among said N×M divisional elements is connected to a corresponding one of said output pads and a second side of the one divisional element is connected to a corresponding one of said power supply pads such that the first and second sides being opposite sides of the one divisional element along the second direction, and
    a first side of another divisional element of the two neighboring divisional elements among said N×M divisional elements is connected to a corresponding one of said power supply pads and a second side of the another divisional element is connected to a corresponding one of said output pads such that the first and second sides being opposite sides of the another divisional element along the second direction.

2. The semiconductor device according to claim 1 further comprising:
    a semiconductor integrated circuit body having said N×M divisional elements, said N×M output pads, said N×M output wires, said N×M power supply pads, and said N×M power supply wires; and
    an insulating layer formed on said semiconductor integrated circuit body.

3. The semiconductor device according to claim 2 further comprising:
    N×M output electroconductive parts each formed on said N×M output pads to pass through said insulating layer from an one side to another side, respectively;
    N×M power supply electroconductive parts each formed on said N×M power supply pads to pass through said insulating layer from the one side to the other side, respectively; and
    a rewiring layer formed on the other side of said insulating layer.

4. The semiconductor device according to claim 3, wherein said N×M output electroconductive parts and said N×M power supply electroconductive parts are bumps or posts.

5. The semiconductor device according to claim 3, wherein the rewiring layer includes:
    N output coupling lead wires connecting together said N×M output electroconductive parts such that said N×M output electroconductive parts are divided into groups corresponding to said semiconductor power elements respectively; and
    a single power supply coupling lead wire commonly connecting together said N×M power supply electroconductive parts.

6. The semiconductor device according to claim 5 further comprising:
   N external output electrodes connected to said N output coupling lead wires respectively; and
   an external power supply electrode connected to said power supply coupling lead wire.

7. The semiconductor device according to claim 6, wherein said N external output electrodes are provided over some of said N×M output electroconductive parts.

8. The semiconductor device according to claim 6, wherein said external power supply electrode is provided over one of said N×M said power supply electroconductive parts.

9. The semiconductor device according to claim 6, wherein said N external output electrodes and said external power supply electrode are ball electrodes.

10. The semiconductor device according to claim 6, wherein said external power supply electrode receives a power supply voltage or a ground voltage.

* * * * *